United States Patent [19]

Connolly, Jr. et al.

[11] 4,154,530

[45] May 15, 1979

[54] LASER BEAM ERROR CORRECTING PROCESS

[75] Inventors: Joseph J. Connolly, Jr.; Thomas M. Frederiksen, both of San Jose, Calif.

[73] Assignee: National Semiconductor Corporation, Santa Clara, Calif.

[21] Appl. No.: 863,279

[22] Filed: Dec. 22, 1977

[51] Int. Cl.² .............................................. G01B 11/26
[52] U.S. Cl. ............................ 356/152; 219/121 LM; 250/201; 356/400
[58] Field of Search ............... 356/152, 172; 250/201, 250/202; 219/85 BA, 85 BM, 121 L, 121 LM

[56] References Cited

U.S. PATENT DOCUMENTS

| | | | |
|---|---|---|---|
| 2,352,179 | 6/1944 | Bolsey | 356/172 |
| 3,316,800 | 5/1967 | Kibler | 250/201 |
| 3,388,461 | 6/1968 | Lins | 219/121 |
| 3,401,589 | 9/1968 | Druschel et al. | 356/152 |
| 3,699,649 | 10/1972 | McWilliams | 219/121 LM |
| 3,758,745 | 9/1973 | Wilker et al. | 219/121 LM |
| 3,838,274 | 9/1974 | Doubek, Jr. et al. | 356/152 |
| 3,966,329 | 6/1976 | Dickey | 356/152 |
| 3,989,385 | 11/1976 | Dill et al. | 356/152 |

Primary Examiner—S. C. Buczinski
Attorney, Agent, or Firm—Gail W. Woodward

[57] ABSTRACT

A laser beam is employed to trim monolithic integrated circuits in wafer form in a step and repeat machine. The step and repeat action is adjusted to bring successive circuits on the wafer into trimming relationship with the laser. The circuit is measured and trimming accomplished to adjust the circuit performance to a precise specification. The step and repeat operation introduces a small error that accumulates as stepping proceeds. A laser beam error detector pattern is incorporated into the integrated circuit wafer and is designed to produce a response when the beam impingement error exceeds a predetermined value. The detector output causes the laser beam to be translated by an increment equal to the error and in the opposite direction. As a result, the laser beam aiming error is controlled by a known pattern rather than by an unknown cumulative error.

10 Claims, 3 Drawing Figures

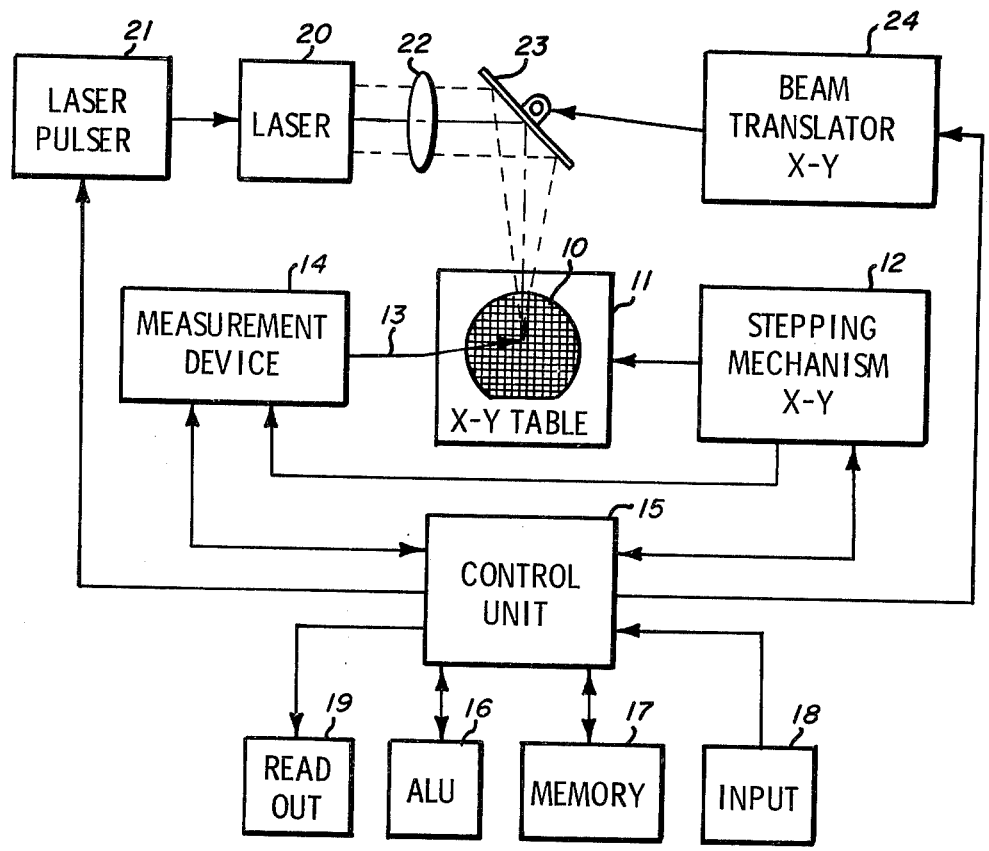
Fig_1
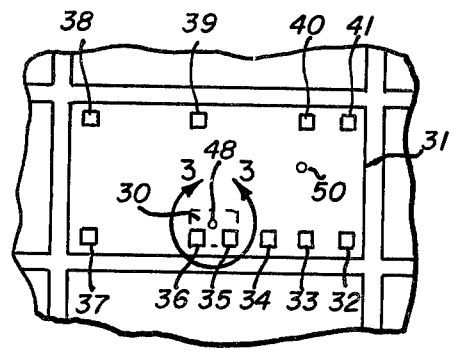
Fig_2
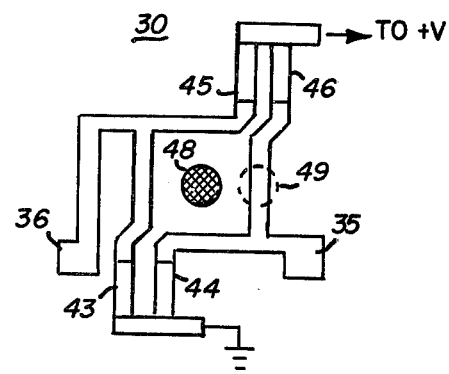
Fig_3

4,154,530

LASER BEAM ERROR CORRECTING PROCESS

BACKGROUND OF THE INVENTION

This application relates to a process for automatically correcting aiming errors in a laser trimming operation.

Copending patent application Ser. No. 860,927 was filed by Robert A. Cometta on Dec. 15, 1977 and assigned to the assignee of the present invention. This application, titled AUTOMATIC CONTROL OF INTEGRATED CIRCUIT TRIMMING, shows how a commercial monolithic integrated circuit (IC) can be precision trimmed in wafer form on automatic machinery of the kind commonly used in IC manufacturing processes.

Our copending application Ser. No. 863,280 filed by us on Dec. 22, 1977, and assigned to the assignee of the present invention, is titled LASER ALIGNMENT DETECTOR. It discloses a device that can be incorporated into a small area on an IC and used to indicate alignment error in laser beam impingement. Alternatively, the detector can be used to precisely locate a laser beam with respect to an IC.

This permits determining the beam impingement point without resorting to optical observation or detection.

SUMMARY OF THE INVENTION

It is an object of the invention to provide an automatic process for correcting laser beam aiming errors in a step and repeat integrated circuit wafer fabrication operation.

It is a further object of the invention to use the information from a detector element fabricated into an integrated circuit to correct laser beam impingement errors in a step and repeat integrated circuit laser trimming system operating on integrated circuit wafers.

These and other objects are achieved in the following process. A wafer containing a plurality of IC patterns is located in a step and repeat machine that also includes means for making probe contact to a single IC on the wafer. The machine will successively index each IC on the wafer to the probe position and measure the IC operation. A laser incorporated into the machine can be used to trim the IC to a precision specification while the IC is in the probe location. The step and repeat accuracy is high but there is typically a small error that tends to accumulate as stepping proceeds. To compensate this error, and also errors due to wafer rotational misalignment, a detector pattern is incorporated into the IC and is activated when the IC is probed. The laser is directed to a reference location, which contains a detector, and fired. The detector is designed to produce an indication when the laser impingement point error exceeds a predetermined value. The detector output is employed as a signal to translate the laser by an amount equal to the predetermined error and in the opposite direction. Thus, whenever the cumulative aiming error exceeds a predetermined value, it is automatically corrected. After error correction the IC is trimmed in the conventional manner.

BRIEF DESCRIPTION OF THE DRAWING

FIG. 1 is a block diagram of an apparatus suitable for practicing the invention;

FIG. 2 is a fragmentary showing of a portion of the topography of an IC wafer; and FIG. 3 shows the details of structure inside the circle 3—3 of FIG. 2.

DESCRIPTION OF THE INVENTION

FIG. 1 shows an apparatus, in block diagram form, which is capable of practicing the process of the invention. An IC wafer 10 is secured (by means not shown) to a step and repeat table 11 which can be translated in two dimensions by a stepping mechanism 12. Wafer 10 is typical of its kind. It can be made of silicon and for example can be about four inches in diameter with an orientation flat as shown. Such a wafer can contain, for example, several thousand IC devices arrayed in rows and columns on its surface. These devices are manufactured using conventional photolithographic and semiconductor device processing. The individual IC devices are substantially identical and are precisely located in incremental positions. Typically, stepping mechanism 12 indexes table 11 in horizontal increments equal to adjacent IC spacing so that a row of circuits can be addressed sequentially along the X axis. When the edge of the wafer is encountered, the mechanism then increments the table in the Y axis to pick up the adjacent row and the X axis increments are then reversed to traverse the wafer on the next row. This sequence is continued until the entire wafer has been scanned circuit by circuit.

As each IC is brought into registry, an array of contact probes designated 13 is moved into contact with the IC so that a probe mates with each of the desired IC pads. The pads are large enough to make probe contacting relatively easy and reliable. Typically, an IC is indexed into position and the probe manually adjusted for contact using optical viewing means not shown. Once the probes are adjusted, mechanism 12 will first lift the probes out of contact, step to the next circuit, and bring probes 13 back into contact. The stepping accuracy is quite good and once adjusted the probes will hit the intended pads on all of the circuits on a wafer.

However, the pads are deliberately made of substantial size so that subsequently applied leads will not need to be precisely located. Accordingly, even though the machine indexes the probes with sufficient accuracy to ensure hitting a pad, there can be errors that are intolerable when precision circuit trimming is attempted. There are several sources of error. The initial probe alignment may be slightly off, step interval can have a slight error and the wafer azimuth can be off. In this last situation, even though the wafer includes an orientation flat, precise orientation requires great care and skill. Typically, a slight azimuth error is present.

The entire machine operation is under the control of control unit 15 which either includes, or is connected to, an arithmetic logic unit 16 and a memory device 17. Elements 15, 16, and 17 are typically combined into a conventional microprocessor which makes automatic operation readily feasible. The system is addressed by an input device 18 which can be a keyboard. Informatin can be read out on device 19 which could be a CRT display. Typically devices 18 and 19 are combined into a conventional computer terminal configuration. Readout 19 typically includes a printer for recording IC performance permanently.

Probes 13 are coupled to measurement device 14 which contains programmable power supplies to render the IC under test operative. It also contains programmable test devices for performing active measurements. Typically all of the elements in mechanism 12 and measurement device 14 are under digital control from control unit 15.

As taught in copending application Ser. No. 860,927 filed Dec. 15, 1977, a laser 20 can be associated with the above-described step ad repeat mechanism. Laser 20 is operated by pulser 21 and has its output focused by lens 22 and directed by mirror 23 onto wafer 10. Mirror 23 is operated by beam translator 24 to shift the laser beam impingement in the X and Y directions. Beam translator 24 and pulser 21 are also under digital control from control unit 15.

As pointed out above, the step and repeat mechanism will adequately index the IC devices on wafer 10 for contact by probes 13. However, there are typically small errors in stepping and these tend to accumulate as stepping proceeds. Such error can seriously degrade laser trim performance, particularly where precision trimming is required.

In accordance with the process of the invention, a laser beam detector 30 is incorporated into wafer 10 as shown in FIG. 2, which represents a fragment of IC wafer 10 topography. Rectangle 31 is the outline of a single IC on the wafer. It is to be understood that IC 31 of FIG. 2 is not to any scale and most of the circuitry details have been omitted. No details are shown in the adjacent IC devices. A series of pads 32–41 are shown around the edge of IC 31. These pads are to ultimately provide for lead connections to be made to the IC. In wafer form the pads can be used for making IC contact by way of probes 13 of FIG. 1. Beam detector 30 is shown in expanded detail in FIG. 3. Pads 35 and 36 comprise test points on a metallization pattern as shown. Elements 43–46 represent resistors having substantially equal value. Resistors 43 and 44 are coupled via metallization to the IC ground. Resistors 45 and 46 are coupled via metallization to a potential point (+V) on the IC.

Point 48 represents the reference of target laser beam impingement point. During initial setups the laser is manually aimed at this point. As long as the laser beam impingement is inside the rectangle formed by the metallization, it can be seen that both pads 35 and 36 will be at +V/2 with respect to ground. When there is an error in laser beam impingement sufficient to move the beam across the metallization, as shown in dashed outline at 49, the pad potentials will shift. For example, with the impingement of 49 the potential at pad 35 will fall to ground potential. Reading the potentials at pads 35 and 36 will reveal when the error exceeds the value predetermined by the size of the metal pattern. The potentials will also reveal the direction of the beam error. The microprocessor which includes elements 15-17 can be programmed so that when an error is detected, beam translator 24 is operated to produce an impingement translation in a direction that is opposite to the error direction and of a magnitude that will translate the beam back to position 48 of FIG. 3.

From the above it can be seen that the system is fully automatic and the maximum beam impingement error can be controlled by the geometrical design of detector 30. Errors in either the X or Y axis of impingement will be corrected, thereby offsetting errors in X or Y axis stepping and/or wafer orientation.

Once the beam impingement is precisely established inside the detector, any working area on IC 31 can be specified in terms of its coordinates. For example, if working is desired in area 50, beam translator 24 is incremented in the necessary X and Y units and laser pulser 21 operated to achieve working.

While the above described system employs a particular beam detector, other configurations can be used as described in our copending application Ser. No. 863,280 filed Dec. 22, 1977. Also, while single pulse laser operation has been shown and described, multipulse operation is readily feasible. For example, if desired when horizontal scanning is in operation, the horizontal beam impingement location can be set as follows. Initially the control unit can direct the laser beam to location 48 of FIG. 3. Then the laser is pulsed and translated in the X direction toward location 49. The pulses and translation are set to cause the beam impingements to overlap. This is continued until the detector arm is severed, at which time the laser beam location is precisely known horizontally at location 49. The Y direction can similarly be determined by Y-axis translation to sever one of the horizontal bars. Thus in addition to the auto correction mode, the invention contemplates the mode of using the beam detector to precisely locate the beam impingement. This affords an even greater aiming precision.

The invention has been described and means for accomplishing it set forth. There are numerous alternatives and equivalents that are within the spirit and intent of the invention that will occur to a person skilled in the art. For example, while the preferred embodiment shows laser trimming, the invention could be applied as well using electron beam or ion beam machining or some other form of energy beam. Accordingly, it is intended that the invention be limited only by the claims that follow.

We claim:

1. The process for correcting beam alignment errors in automatic equipment employing an energy beam in the sequential treatment of critical areas on a workpiece, said process comprising the steps:
    locating error detection means at predetermined locations on said workpiece, said error detection means providing an indication of said beam alignment;
    stepping said workpiece relative to the impingement area of said energy beam to bring successive areas of said workpiece into working relationship with said energy beam;
    directing said energy beam at said error detection means;
    correcting the aiming of said energy beam relative to said workpiece in response to said indication from said error detection means; and,
    following the step of correcting the aiming of said energy beam, redirecting said energy beam to said critical area on said workpiece to effect working thereof.

2. The process of claim 1 in which said error detection means is operated to provide an indication when said error exceeds a predetermined magnitude and said correcting step corrects by the amount of said predetermined magnitude.

3. The process of claim 2 wherein said error detection means additionally detects the direction of said error and wherein the step of correcting the aiming of said energy beam includes determining the direction of said error and correcting the aiming of said energy beam oppositely to said error.

4. The process of claim 3 wherein said step of directing said energy beam at said error detection means includes the step of pulsing said energy beam.

5. The process of claim 4 further including the step of translating said beam while a plurality of pulses is applied from said energy beam.

6. The process of claim 5 wherein said translation is adjusted to produce overlapping of said plurality of pulses on said workpiece.

7. The process of claim 1 wherein said correcting step includes translating and pulsing said laser until said detector produces said indication thereby to locate said beam with precision relative to said detector.

8. The process of claim 7 wherein said translating and said pulsing are operated to produce an overlapping laser beam impingement pattern.

9. The process of claim 8 wherein said pulsing and translation are operated to locate said beam in two directions.

10. The product produced by the process of claim 1.

* * * * *